United States Patent
Hayase et al.

(10) Patent No.: US 8,530,738 B2
(45) Date of Patent: Sep. 10, 2013

(54) DYE-SENSITIZED SOLAR CELL

(75) Inventors: Shuzi Hayase, Kitakyushu (JP); Yoshihiro Yamaguchi, Kitakyushu (JP)

(73) Assignees: National University Corporation Kyushu Institute of Technology, Kitakyushu-shi (JP); Nippon Steel & Sumikin Chemical Co., Ltd., Tokyo (JP)

( * ) Notice: Subject to any disclaimer, the term of this patent is extended or adjusted under 35 U.S.C. 154(b) by 12 days.

(21) Appl. No.: 13/254,920

(22) PCT Filed: Mar. 4, 2010

(86) PCT No.: PCT/JP2010/001505
§ 371 (c)(1),
(2), (4) Date: Sep. 6, 2011

(87) PCT Pub. No.: WO2010/103759
PCT Pub. Date: Sep. 16, 2010

(65) Prior Publication Data
US 2011/0315203 A1 Dec. 29, 2011

(30) Foreign Application Priority Data

Mar. 11, 2009 (JP) .................................. 2009-057673

(51) Int. Cl.
*H01L 31/0248* (2006.01)
*H01L 31/0216* (2006.01)

(52) U.S. Cl.
USPC ........... 136/255; 136/256; 136/263; 136/252; 136/249; 136/244; 438/85; 438/57

(58) Field of Classification Search
USPC ................. 136/255, 256, 263, 252, 249, 244; 438/85, 57
See application file for complete search history.

(56) References Cited

U.S. PATENT DOCUMENTS

2001/0032665 A1* 10/2001 Han et al. ...................... 136/256
2004/0211458 A1* 10/2004 Gui et al. ...................... 136/244
(Continued)

FOREIGN PATENT DOCUMENTS

| JP | 2006-147280 A1 | 6/2006 |
| JP | 2007-73505 A1 | 3/2007 |
| JP | 2008-16405 A1 | 1/2008 |
| JP | 2008-53042 A1 | 3/2008 |
| WO | 2008004580 | 1/2008 |

OTHER PUBLICATIONS

Yamaguchi et al., "Series-connected tandem dye-sensitized solar cell for improving efficiency to more than 10%", Solar Energy Materials & Solar Cells 93 (2009) 733-736.*

(Continued)

*Primary Examiner* — Golam Mowla
(74) *Attorney, Agent, or Firm* — Kratz, Quintos & Hanson, LLP

(57) ABSTRACT

There is provided a tandem-type dye-sensitized solar cell having a novel structure whereby optical absorption efficiency is improved and which can be manufactured at low cost.

A dye-sensitized solar cell 10 comprises an anode substrate 12, a first dye-carrying porous oxide semiconductor layer 14, an electrolytic solution layer 16a, a porous support layer 18, a second dye-carrying porous oxide semiconductor layer 20, an electrolytic solution layer 16b, and a cathode substrate 22, arranged in order from an optical incidence side. The porous support layer 18 supports an iodine redox catalyst layer 19. Electrons derived by a conductor from a conductor layer 12b are introduced to the cathode substrate 22, thereby configuring, for example, a battery circuit for lighting purposes.

3 Claims, 6 Drawing Sheets

Incident Light

(56) References Cited

U.S. PATENT DOCUMENTS

| | | | |
|---|---|---|---|
| 2006/0162770 A1* | 7/2006 | Matsui et al. | 136/263 |
| 2009/0211639 A1* | 8/2009 | Park et al. | 136/262 |
| 2009/0242027 A1 | 10/2009 | Inoue et al. | |
| 2009/0314339 A1* | 12/2009 | Hayase et al. | 136/256 |
| 2012/0048357 A1* | 3/2012 | Hayase et al. | 136/255 |

OTHER PUBLICATIONS

Extended European Search Report mailed Jan. 18, 2013 in counterpart application No. 10750517.4-1235/24080-57.

W. Kubo, et al.; "Dye-sensitized solar cells: improvement of spectral response by tandem structure;" Journal of Photochemistry and Photobiology A: Chemistry; vol. 164; 2004; pp. 33-39/p. 6 of specification/Cited in International Search Report.

URL http://techon.nikkeibp.co.jp/article/NEWS/20080306/148570/; Nikkei Electronics; Mar. 6, 2008; 2 sheets and cover sheet (3 sheets total)/p. 6 of specification.

International Search Report for International Application No. PCT/JP2010/001505 dated May 10, 2010.

* cited by examiner

Incident Light

Incident Light

Incident Light

Incident Light

Dye 3

DYE-SENSITIZED SOLAR CELL

TECHNICAL FIELD

The present invention relates to a so-called tandem-type dye-sensitized solar cell in which two porous oxide semiconductor layers each carrying a dye are provided in series with respect to a traveling direction of light.

BACKGROUND ART

The dye-sensitized solar cell is called a wet solar cell, a Graetzel cell, or the like, and has an electrochemical cell structure as typified by an iodine solution without using a silicon semiconductor. Specifically, the dye-sensitized solar cell has a simple structure in which an iodine solution or the like is disposed as an electrolyte solution between a porous semiconductor layer (porous oxide semiconductor layer), such as a titania layer, formed by baking titanium dioxide powder or the like onto a transparent conductive glass plate (a transparent substrate having a transparent conductive film laminated thereon and serving as an anode substrate) and making a dye adsorbed onto the baked powder, and a counter electrode composed of a conductive glass plate (conductive substrate serving as an cathode substrate). Electrons are generated as the result of solar light introduced into the dye-sensitized solar cell from the transparent conductive glass plate side being absorbed by the dye.

The dye-sensitized solar cell is inexpensive in terms of the materials thereof and does not need a large-scaled facility for its fabrication, thus attracting attention as a low-cost solar cell.

While the dye-sensitized solar cell is currently reported to have a solar light conversion efficiency of 11%, further improvements are required to be made to the conversion efficiency. Thus, studies have been made from various viewpoints.

As one of the studies, attempts have been made in various ways to improve optical absorption efficiency.

That is, various researches have been heretofore made on dyes Used in the dye-sensitized solar cell. However, any dyes capable of absorbing light having a wide wavelength range from 400 nm up to a near-infrared or longer wavelength with high efficiency have not been obtained so far. Consequently, light not absorbed by a porous semiconductor layer having a dye adsorbed thereto directly results in absorption loss. Note that it is conceivable to increase the thickness of the porous semiconductor layer having a dye adsorbed thereto, for the purpose of increasing optical absorption efficiency. In practice, however, this may not lead to absorption efficiency improvements for various reasons, but contrarily may cause absorption efficiency to decrease.

In order to improve optical absorption efficiency, a study is being made of a so-called tandem-type dye-sensitized solar cell in which two porous oxide semiconductor layers each carrying a dye are provided in series with respect to the traveling direction of light.

For example, a study has been made of a technique to extract electricity in parallel from two cells configured by laminating over each other two porous semiconductor layers having dissimilar dyes adsorbed thereto and arranging an electrode containing an FTO (fluorine-doped tin oxide film) between the two porous semiconductor layers (see Non Patent Literature 1).

In addition, a study has been made of a dye-sensitized solar cell in which a first anode having a first sensitizing dye and a second anode having a second sensitizing dye different from the first sensitizing dye are disposed separately from each other, a cathode typically made of a mesh electrode is provided between the two anodes, and an electrolyte is filled between these respective electrodes (see Patent Literature 1).

The patent literature states that incident light input from the first anode side can be efficiently utilized by parallel-connecting two battery cells formed on both sides of the cathode of this cell.

Still additionally, a study has been made of a dye-sensitized solar cell in which anodes provided with porous titanium oxide films each having a sensitizing dye adsorbed thereto and a cathode serving as a counter electrode are disposed separately from each other, a transparent counter electrode is provided between each anode electrode and the cathode electrode, and an electrolyte is filled between these respective electrodes (see Patent Literature 1). In this case, the anode-side surface of an insulating layer formed as an intermediate layer of the transparent counter electrode functions as the cathode electrode and the cathode-side surface of the insulating layer of the transparent counter electrode functions as the anode electrode. Consequently, the dye-sensitized solar cell is similar in configuration to the dye-sensitized solar cell of Patent Literature 1 described above in which the two battery cells formed on both sides of the transparent counter electrode are parallel-connected (see Non Patent Literature 2). Note that this Non Patent Literature 2 does not disclose any more information than is deciphered from drawings, and therefore, the materials, structure and the like of the transparent electrode are uncertain.

The inventors et al. of the present invention have proposed a dye-sensitized solar cell, though not such a tandem-type dye-sensitized solar cell as described above, in which two porous semiconductor layers are arranged, a conductive layer (collecting electrode) having a through-hole between the two porous semiconductor layers is provided, and the conductive layer is electrically connected to a transparent conductive film of a transparent substrate provided on an optical incidence side (see Patent Literature 2).

According to this dye-sensitized solar cell, high conversion efficiency can be obtained even if the thickness of the porous semiconductor layers is increased.

A study has been made of another dye-sensitized solar cell, specifically an np tandem-type dye-sensitized solar cell, in which an anode substrate, a dye-sensitized n-type semiconductor layer, an electrolyte layer, a dye-sensitized p-type semiconductor layer, and a cathode substrate are disposed in this order (see Patent Literature 3).

The patent literature states that, according to this dye-sensitized solar cell, the conversion efficiency of the cell as a whole can be improved by improving p-side conversion efficiency by reducing p-side electrical resistance.

CITATION LIST

Patent Literature

Patent Literature 1: Japanese Patent Laid-Open No. 2008-53042
Patent Literature 2: Japanese Patent Laid-Open No. 2008-16405
Patent Literature 3: Japanese Patent Laid-Open No. 2006-147280

Non Patent Literature

Non Patent Literature 1: W. Kubo et al/Journal of Photochemistry and Photobiology A Chemistry 164 (2004)

Non Patent Literature 2: An article of Nikkei Electronics searched on Mar. 4, 2009 through Internet; URL:http://techon.nikkeibp.co.jp:80/article/NEWS/20080306 /148570/

SUMMARY OF INVENTION

Technical Problem

However, every solar cell of the above-described related arts involves, for example, a further improvement in optical absorption efficiency, an increase in the manufacturing cost of the cell caused by using many expensive transparent conductive films for reasons of a cell structure, or disadvantages when the cell is increased in size. Thus, the related arts are considered to have much room for further improvement.

The present invention has been accomplished in view of the above-described problems. Accordingly, an object of the present invention is to provide a tandem-type dye-sensitized solar cell having a novel structure whereby optical absorption efficiency is improved and which can be manufactured at low cost.

Solution to Problem

A dye-sensitized solar cell according to the present invention is comprised of an anode substrate, a first dye-carrying porous oxide semiconductor layer, a first electrolytic solution layer, a redox catalyst layer, a porous support layer, a second dye-carrying porous oxide semiconductor layer, a second electrolytic solution layer, and a cathode substrate, arranged in order from an optical incidence side.

A dye-sensitized solar cell according to the present invention is comprised of an anode substrate, a first dye-carrying porous oxide semiconductor layer, a first electrolytic solution layer, a redox catalyst layer, a portion of a second dye-carrying porous oxide semiconductor layer, a porous support layer, the rest of the second dye-carrying porous oxide semiconductor layer, a second electrolytic solution layer, and a cathode substrate, arranged in order from an optical incidence side.

A dye-sensitized solar cell according to the present invention is comprised of an anode substrate, a first dye-carrying porous oxide semiconductor layer, a first electrolytic solution layer, a porous conductive metal support layer, a second dye-carrying porous oxide semiconductor layer, a second electrolytic solution layer, and a cathode substrate, arranged in order from an optical incidence side.

A dye-sensitized solar cell according to the present invention is comprised of an anode substrate, a first dye-carrying porous oxide semiconductor layer, a first electrolytic solution layer, a portion of a second dye-carrying porous oxide semiconductor layer, a porous conductive metal support layer, the rest of the second dye-carrying porous oxide semiconductor layer, a second electrolytic solution layer, and a cathode substrate, arranged in order from an optical incidence side.

In each dye-sensitized solar cell according to the present invention, a conductor layer composing the anode substrate preferably includes a porous conductive metal layer.

In each dye-sensitized solar cell according to the present invention, a dye carried by the second dye-carrying porous oxide semiconductor layer preferably has an optical absorption wavelength longer than the optical absorption wavelength of a dye carried by the first dye-carrying porous oxide semiconductor layer.

Advantageous Effects of Invention

A dye-sensitized solar cell according to the present invention comprises an anode substrate, a first dye-carrying porous oxide semiconductor layer held by the anode substrate, a first electrolytic solution layer, and a cathode substrate, arranged in order from an optical incidence side, and further includes a redox catalyst layer, a porous support layer, a second dye-carrying porous oxide semiconductor layer, and a second electrolytic solution layer, or further includes a porous conductive metal support layer, a second dye-carrying porous oxide semiconductor layer, and a second electrolytic solution layer. Consequently, the dye-sensitized solar cell is superior in optical absorption efficiency, and does not necessarily require an expensive transparent conductive film or need not use the film in large amounts. Thus, the manufacturing cost of the cell can be reduced.

DESCRIPTION OF EMBODIMENTS

Embodiments of the present invention will be described hereinafter with reference to the accompanying drawings.

Figure 1:
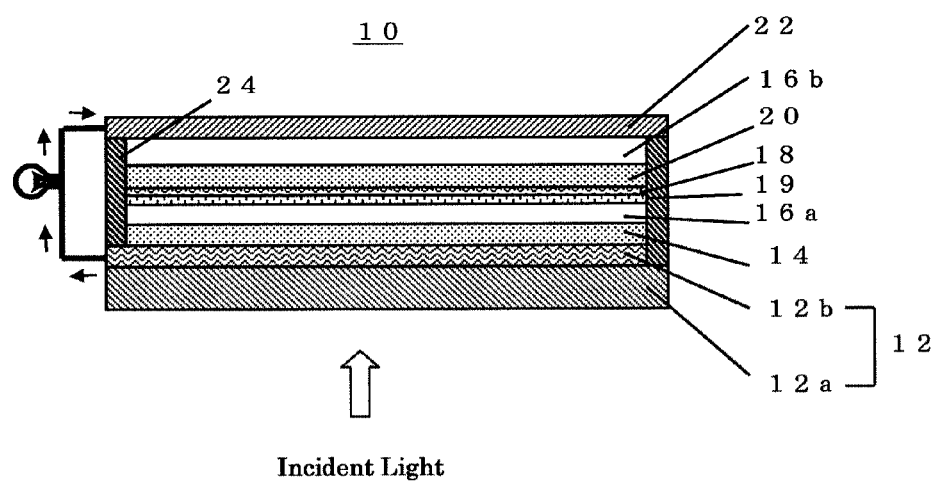
FIG. 1 is a drawing schematically illustrating a configuration of a dye-sensitized solar cell according to a first embodiment of the present invention.

A dye-sensitized solar cell according to a first embodiment of the present invention will be described with reference to FIG. 1.

A dye-sensitized solar cell according to a first embodiment of the present invention (hereinafter, this solar cell may be simply referred to as "first solar cell") 10 comprises an anode substrate 12, a first dye-carrying porous oxide semiconductor layer (hereinafter, this layer may be simply referred to as "first semiconductor layer") 14 held by the anode substrate 12, a first electrolytic solution layer 16a, a porous support layer 18, a second dye-carrying porous oxide semiconductor layer (hereinafter, this layer may be simply referred to as "second semiconductor layer") 20 held by the porous support layer 18, a second electrolytic solution layer 16b, and a cathode substrate 22, arranged in order from an optical incidence side.

Figure 4:
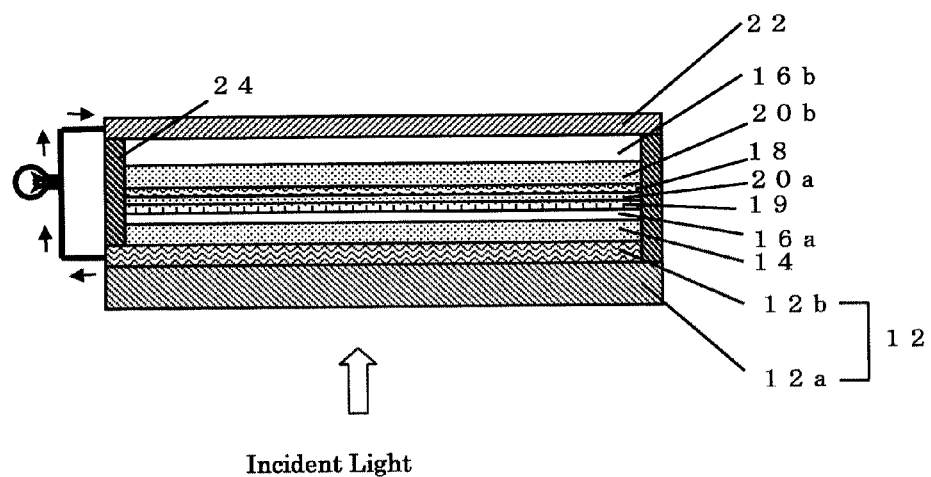
FIG. 4 is a drawing schematically illustrating a configuration of a modified example of the dye-sensitized solar cell according to the first embodiment of the present invention.

An iodine redox catalyst layer 19 is carried on a side of the porous support layer 18 disposed toward the first electrolytic solution layer 16a, i.e., on a surface of the porous support layer 18 exposed toward the first electrolytic solution layer 16a. At this time, a portion 20a of the second dye-carrying porous oxide semiconductor layer 20 may also be arranged on a surface of the porous support layer 18 on the side thereof disposed toward the first electrolytic solution layer 16a of the porous support layer 18, as illustrated in FIG. 4. At that time, the iodine redox catalyst layer 19 is carried on a surface of the second dye-carrying porous oxide semiconductor layer 20 exposed toward the first electrolytic solution layer 16a of the porous support layer 18. Note that in FIG. 4, reference character 20b denotes the rest of the second dye-carrying porous oxide semiconductor layer 20 disposed opposite to the portion 20a of the second dye-carrying porous oxide semiconductor layer with the porous support layer 18 therebetween.

The anode substrate 12 can be composed of, for example, a transparent substrate 12a formed of glass, a resin film or the like and a conductor layer 12b having optical transparency provided on the substrate 12a. In addition, the cathode substrate 22 can be composed of, for example, a commonly-used conductive metal layer. Note that in FIG. 1, reference numeral 24 denotes a spacer whereby the electrolytic solution layers 16a and 16b and the like are sealed and fixed.

Electrons derived by a conductor from the conductor layer 12b are introduced to the cathode substrate 22, thereby configuring, for example, a battery circuit as a lighting power source.

The solar cell 10 is structurally a so-called tandem-structure (tandem-type) cell in which a first semiconductor layer 14 and a second semiconductor layer 20 are laminated in the traveling direction of light. If viewed from the working face of the cell, the solar cell can be said to be a series-connected cell in which two battery cells are laid out in series.

The conductor layer 12b of the anode substrate 12 is not limited in particular, but an ITO film (tin-doped indium film), an FTO film (fluorine-doped tin oxide film), an $SnO_2$ film, or the like can be used for the conductor layer 12b. The conductor layer 12b may include a porous conductive metal layer, in addition to the FTO or the like. As such a porous conductive metal layer, a metal mesh, a metal layer in which numerous holes have been formed previously, a porous metal layer formed by a frame-spraying method or a thin-film formation method, or the like can be used.

These points of discussion are also true for a second embodiment to be described later. In the second embodiment, however, a porous conductive metal support layer 18a is provided in place of the porous support layer 18 of the solar cell 10 according to the first embodiment, and therefore, the conductor layer 12b may be omitted. In that case, the first dye-carrying porous oxide semiconductor layer 14 has to be in contact with the porous conductive metal support layer 18a.

The cathode substrate 22 can be structured as appropriate, by, for example, providing a catalyst membrane on an internal surface of a conductive metal layer.

Note that these points of discussion are also true for the later-described second embodiment.

Dyes carried at the first dye-carrying porous oxide semiconductor layer 14 and the second dye-carrying porous oxide semiconductor layer 20 (hereinafter, these dyes may be respectively referred to as "first and second dyes") are used so as to be adsorbed to a semiconducting material for forming porous semiconductor layers, and have absorptivity over the wavelength range of 400 nm to 1000 nm. Examples of such dyes may include metal complexes, such as ruthenium dye and phthalocyanine dye, having a COOH group, and an organic dye, such as a cyanine dye.

Figure 3:
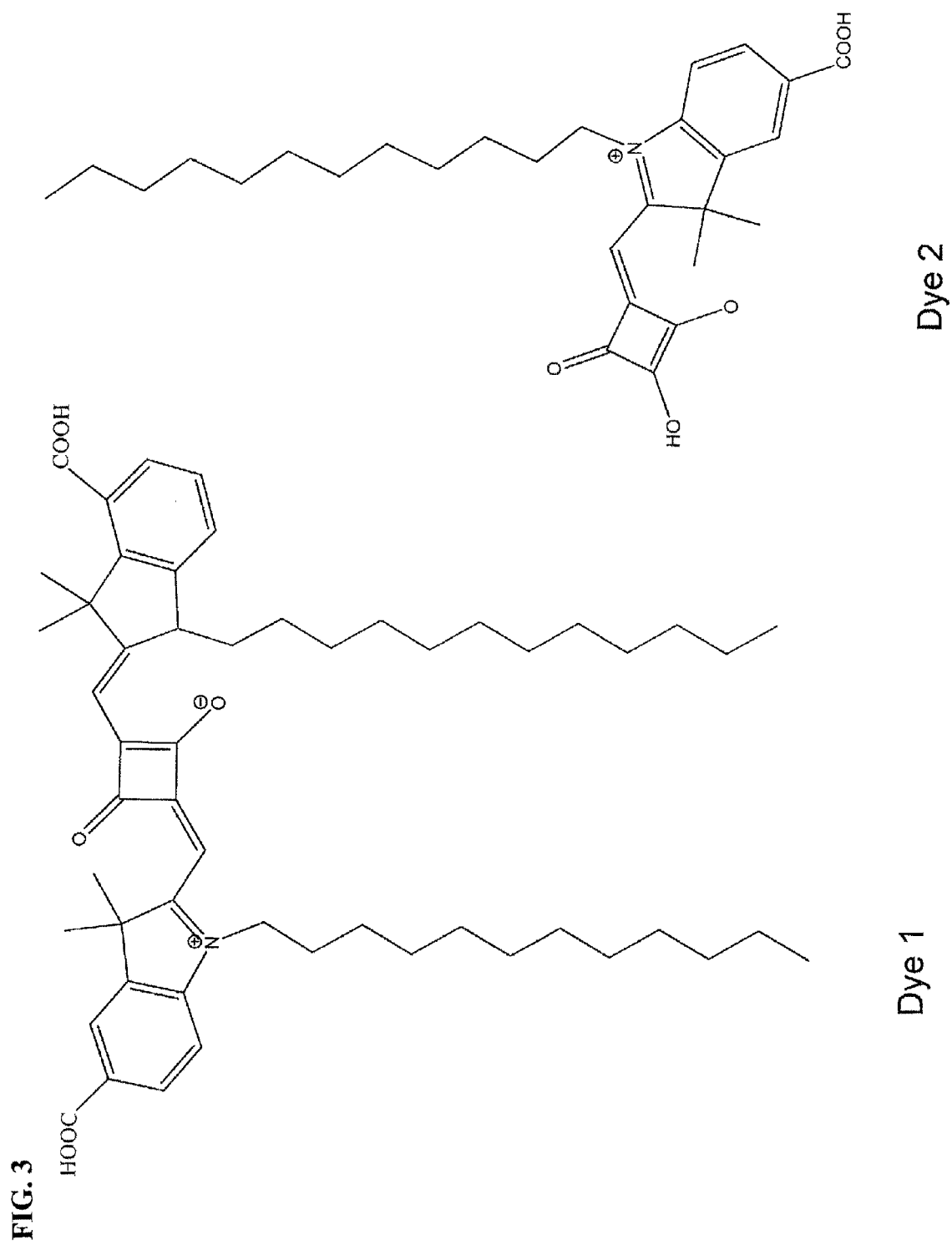
FIG. 3 is a drawing illustrating chemical structures of a first dye (Dye 2) and a second dye (Dye 1).

Dyes of the same type can be used for the first and second dyes. More preferably, however, a dye having, for example, the chemical structure of the Dye 2 shown in FIG. 3 that absorbs short-wavelength light liable to fade away in the course of traveling within the cell is used as the first dye, and a dye having, for example, the chemical structure of the Dye 1 shown in FIG. 3 that absorbs light of longer wavelengths than the first dye as the second dye.

Note that these points of discussion are also true for the later-described second embodiment.

As the semiconducting material of porous oxide semiconductor layers carrying dyes at the first dye-carrying porous oxide semiconductor layer 14 and the second dye-carrying porous oxide semiconductor layer 20, it is possible to use an oxide of metal, such as titanium, tin, zirconium, zinc, indium, tungsten, iron, nickel, or silver.

The porous semiconductor layers are preferably made of a semiconducting material baked at a temperature of 300° C. or higher and, more preferably, at a temperature of 450° C. or higher. On the other hand, an upper limit of baking temperature is not specified in particular, but is preferably sufficiently lower than the melting point of the material of the porous semiconductor layer 14 and, more preferably, 550° C. or lower. If a titanium oxide (titania) is used as the material of the porous semiconductor layer 14, the titanium oxide is preferably baked at such a temperature as not to cause the titanium oxide to make a transition to a rutile crystal, i.e., in a state of anatase crystal in which the conductivity of the titanium oxide is high.

The porous oxide semiconductor layers of the first dye-carrying porous oxide semiconductor layer 14 and the second dye-carrying porous oxide semiconductor layer 20 may be formed of the same semiconducting material, for example, a titanium oxide. More preferably, however, the porous oxide semiconductor layer of the first dye-carrying porous oxide semiconductor layer 14 is formed of a titanium oxide and the porous oxide semiconductor layer of the second dye-carrying porous oxide semiconductor layer 20 is formed of a tin oxide, since the energy level of the conduction band of a tin oxide is lower than the energy level of the conduction band of a titanium oxide and agrees with the LUMO of a dye that absorbs long-wavelength light.

The respective thicknesses of the porous oxide semiconductor layers of the first dye-carrying porous oxide semiconductor layer 14 and the second dye-carrying porous oxide semiconductor layer 20 are not limited in particular, but are preferably 14 μm or larger.

Note that these points of discussion are also true for the later-described second embodiment.

The electrolytic solution layers 16a and 16b contain iodine, lithium ions, ionic liquids, t-butylpyridine, and the like. In the case of, for example, iodine, an oxidation-reduction body composed of a combination of iodide ions and iodine can be used. The oxidation-reduction body contains an appropriate solvent capable of dissolving the body. Note that this point of discussion is also true for the later-described second embodiment.

The porous support layer 18 is not limited in particular, as long as the layer has porosity whereby the layer can sufficiently transmit light and allows an electrolytic solution to pass therethrough, and can securely hold the second dye-carrying porous oxide semiconductor layer 20 even if the porous support layer 18 is a thin film. The porous support layer 18 may be formed of an appropriate inorganic material or of an appropriate metal material.

The iodine redox catalyst layer 19 supported by the porous support layer 18 or the second dye-carrying porous oxide semiconductor layer 20 can be formed of such a material as platinum or a conductive polymer. The iodine redox catalyst layer 19 can be formed by an appropriate film-forming method, such as a sputtering method.

If, in this case, a member corresponding to the porous support layer 18 is a nonporous member, such as a transparent conductive film or a metal film, that disturbs the mobilization of an electrolyte and if amounts of current flowing through a cell (assumed as a cell 1) configured by including the first dye-carrying porous oxide semiconductor layer 14 and a cell (assumed as a cell 2) configured by including the second dye-carrying porous oxide semiconductor layer 20 differ, for example, if a current has difficulty in flowing through the cell 2, that serves as a rate-limiting factor, and therefore, cell performance degrades. In an extreme case, no currents flow through the cell 2 even if light lacking in long wavelengths enters the cell 2, if a dye that absorbs long wavelengths is used for the cell 2.

In contrast, according to the dye-sensitized solar cell 10 according to the first embodiment of the present invention, the mobilization of an electrolytic solution between the cell 1 and cell 2 is secured, and therefore, no consideration needs to be given to the balance of absorbed amounts between the Dye 1 and Dye 2. Thus, the cell 10 still functions even if a current does not flow through the cell 2 at all.

According to the heretofore-described dye-sensitized solar cell 10 according to the first embodiment of the present invention, a high voltage can be obtained with high power generation efficiency. In addition, since electrodes can be formed at lower cost, compared with a transparent conductive film, such as an FTO film, cells can be manufactured at low cost. Yet additionally, power loss caused by electrodes when a cell is increased in size is smaller, compared with a FTO film or the like.

Next, a dye-sensitized solar cell according to the second embodiment of the present invention will be described with reference to FIG. 2. Note that components corresponding to those of the above-described first solar cell 10 will not be described again here.

The dye-sensitized solar cell (hereinafter, this solar cell may be simply referred to as "second solar cell") 10a is basically the same in the stack structure of respective members and the like as the first solar cell 10.

Figure 2:
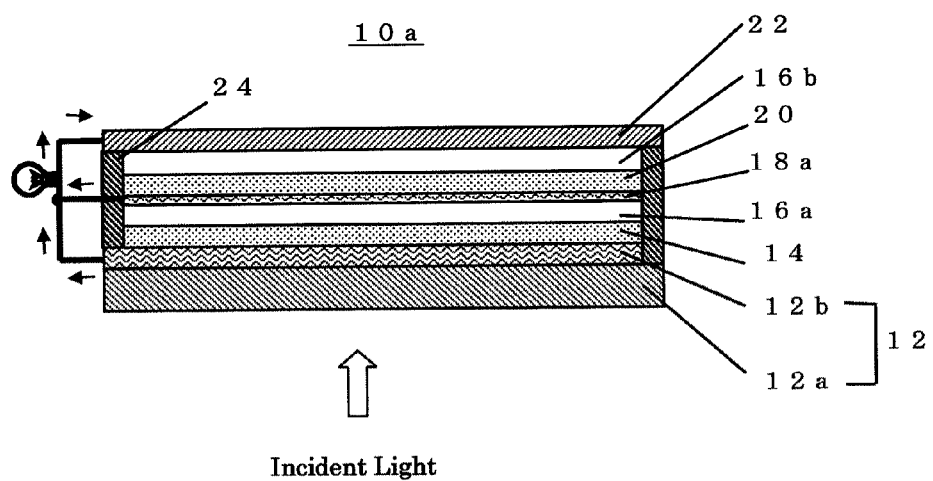
FIG. 2 is a drawing schematically illustrating a configuration of a dye-sensitized solar cell according to a second embodiment of the present invention.
Figure 5:
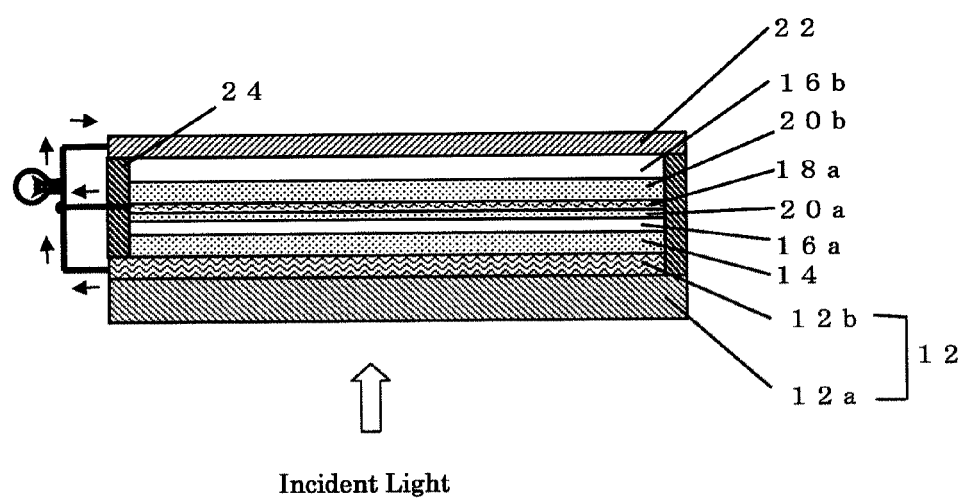
FIG. 5 is a drawing schematically illustrating a configuration of a modified example of the dye-sensitized solar cell according to the second embodiment of the present invention.

In terms of battery structure, the solar cell 10a according to the second embodiment differs from the first solar cell 10 in that, as illustrated in FIG. 2, a porous conductive metal support layer 18a is provided in place of the porous support layer 18 of the solar cell 10 according to the first embodiment and the iodine redox catalyst layer 19 is not provided. At this time, a portion 20a of the second dye-carrying porous oxide semiconductor layer 20 may also be arranged on a surface of the porous support layer 18 on the side thereof disposed toward the first electrolytic solution layer 16a of the porous support layer 18, as illustrated in FIG. 5. Note that, in FIG. 5, reference character 20b denotes the rest of the second dye-carrying porous oxide semiconductor layer 20 disposed opposite to the portion 20a thereof with the porous support layer 18 therebetween.

In addition, the circuit configuration of the solar cell is such that a conductor for deriving electrons from the porous conductive metal support layer 18a is provided in parallel with a conductor for deriving electrons from the anode substrate 12, so that two battery cells are arranged in parallel.

As the porous conductive metal support layer 18a, a metal mesh, a metal layer in which numerous holes have been formed previously, a porous metal layer formed by a frame-spraying method or a thin-film formation method, or the like can be used. Consequently, the porous conductive metal support layer 18a can be formed at low cost.

According to the heretofore-described dye-sensitized solar cell 10a according to the second embodiment of the present invention, a high voltage can be obtained with high power generation efficiency. In addition, since electrodes can be formed at lower cost, compared with a transparent conductive film, such as an FTO film, cells can be manufactured at low cost. Yet additionally, power loss caused by electrodes when a cell is increased in size is smaller, compared with a FTO film or the like.

PRACTICAL EXAMPLES

The present invention will be described further by citing practical examples. It should be noted, however, that the present invention is not limited to the practical examples to be described hereinafter.

Practical Example 1

An FTO film (surface resistance: 10 Ω/sq) was formed on a transparent glass substrate, and titania paste was coated on the FTO film and dried at 450° C. for 30 minutes, thereby fabricating a 2 μm-thick porous titania layer. The above-described first dye (Dye 2) was adsorbed to this porous titania layer to fabricate a first electrode. On the other hand, titanium was film-formed by sputtering on a stainless mesh substrate (25 μm in thickness) including a mesh 20 μm in diameter. Thereafter, titanium was further film-formed using arc plasma while introducing oxygen, thereby fabricating a surface-protected stainless mesh structure. Titania paste was coated on the mesh structure and dried at 450° C. for 30 minutes, thereby fabricating a 2 μm-thick porous titania layer. After platinum was sputtered on a surface of the mesh structure on the side thereof on which the porous titania layer was not provided, the above-described second dye (Dye 2) was adsorbed to this titania layer, thereby fabricating a second electrode. For an electrolytic solution, a gel electrolytic solution prepared by impregnating a porous PTFE (polytetrafluoroethylene) film (50 μm in thickness and 80% in porosity) with an electrolytic solution was used. A counter electrode was fabricated by sputtering platinum on titanium. These components were laminated in sequence to fabricate a solar cell.

The performance values of the solar cell thus obtained (composite cell, i.e., a cell according to the first embodiment of the present invention) when the first electrode and the counter electrode were electrically connected to each other were 0.81 V in Voc, 5.2 mA/cm$^2$ in Jsc, 0.67 in FF, and 2.8% in efficiency. In addition, the performance values of a cell (unit cell 1) fabricated separately from this solar cell and comprised of a first electrode and a counter electrode were 0.4 V in Voc, 5.4 mA/cm$^2$ in Jsc, 0.70 in FF, and 1.5% in efficiency. On the other hand, the performance values of a cell (unit cell 2) fabricated separately from this solar cell and comprised of a second electrode and a counter electrode were 0.42 V in Voc, 4.9 mA/cm$^2$ in Jsc, 0.70 in FF, and 1.44% in efficiency. The composite cell showed a rise in the value of Voc almost comparable to the total value of the unit cell 1 and unit cell 2, compared with the unit cell 1 alone corresponding substantially to conventional cells. For IPCE values, the composite cell showed a peak corresponding to that of the unit cell 1 including a first dye having an absorption wavelength of 500 nm and a peak corresponding to that of the unit cell 2 including a second dye having an absorption wavelength of 700 nm.

Practical Example 2

An FTO film (surface resistance: 10 /sq) was formed on a transparent glass substrate, and titania paste was coated on the FTO film and dried at 450° C. for 30 minutes, thereby fabricating a 2 μm-thick porous titania layer. The first dye was adsorbed to this titania layer to fabricate a first electrode. On the other hand, titanium was film-formed by sputtering on a stainless mesh substrate (25 μm in thickness) including a mesh 20 μm in diameter. Thereafter, titanium was further film-formed using arc plasma while introducing oxygen, thereby fabricating a surface-protected stainless mesh structure. Titania paste was coated on the mesh structure and dried at 450° C. for 30 minutes, thereby fabricating a 2 μm-thick porous titania layer. The second dye was adsorbed to this titania layer, thereby fabricating a second electrode. For an electrolytic solution, a gel electrolytic solution prepared by impregnating a porous PTFE (polytetrafluoroethylene) film (50 μm in thickness and 80% in porosity) with an electrolytic solution was used. A counter electrode was fabricated by sputtering platinum on titanium. These components were laminated in sequence to fabricate a solar cell.

The performance values of the solar cell thus obtained (composite cell, i.e., a cell according to the second embodiment of the present invention) when the first and second electrodes and the counter electrode were electrically connected to each other were 0.4 V in Voc, 12.1 mA/cm$^2$ in Jsc, 0.60 in FF, and 2.9% in efficiency. In addition, the performance values of a cell (unit cell 1) fabricated separately from this solar cell and comprised of a first electrode and a counter electrode were 0.4 V in Voc, 5.4 mA/cm$^2$ in Jsc, 0.70 in FF, and 1.5% in efficiency. On the other hand, the performance values of a cell (unit cell 2) fabricated separately from this solar cell and comprised of a second electrode and a counter electrode were 0.42 V in Voc, 4.9 mA/cm$^2$ in Jsc, 0.70 in FF, and 1.44% in efficiency. The composite cell showed a rise in the value of Voc almost comparable to the total value of the unit cell 1 and unit cell 2, compared with the unit cell 1 alone corresponding substantially to conventional cells. For IPCE values, the composite cell showed a peak corresponding to that of the unit cell 1 including a first dye having an absorption wavelength of 500 nm and a peak corresponding to that of the unit cell 2 including a second dye having an absorption wavelength of 700 nm.

Reference Example 1

Figure 6:
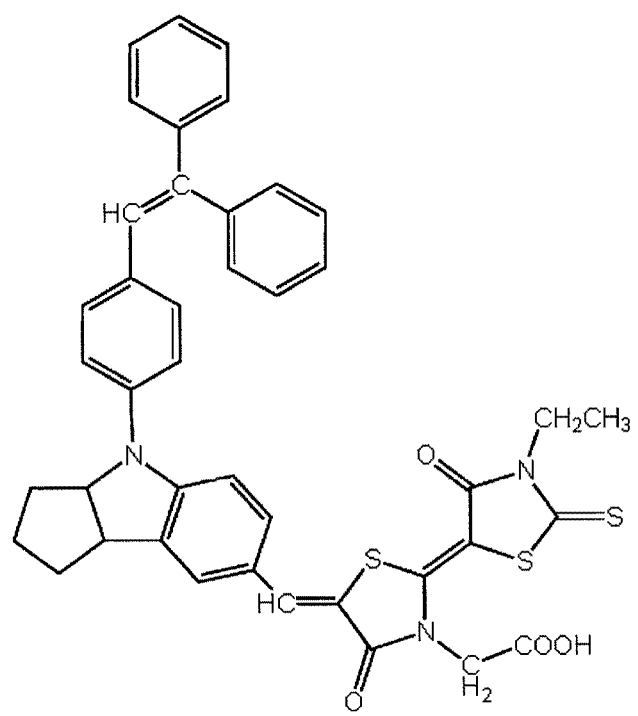
FIG. 6 is a drawing illustrating a chemical structure of a dye (dye 3) different from the first dye (Dye 2) and the second dye (Dye 1).

Titania paste was coated on a stainless mesh substrate (25 μm in thickness) including a mesh 20μm in diameter and dried at 450° C. for 30 minutes, thereby fabricating a porous titania layer. This coating and drying of the titania paste was repeated until the thickness of the porous titania layer reached a predetermined thickness, thereby finally fabricating a 10 μm-thick porous titania layer. A dye (D-149 made by Mitsubishi Paper Mills Limited) having the chemical structure of the dye 3 shown in FIG. 6 was adsorbed to this titania layer to fabricate a second electrode. For an electrolytic solution, a gel electrolytic solution prepared by impregnating a porous PTFE (polytetrafluoroethylene) film (35 μm in thickness and 71% in porosity) with an electrolytic solution was used. A counter electrode was fabricated by sputtering platinum on titanium. The titania layer side of the porous titania layer fabricated as described above and the platinum side of the counter electrode were laminated so as to face each other with the above-described PTFE film therebetween. A PET film (130 μm in thickness) was further laminated on a side of this porous titania layer opposite to the titania layer to fabricate a solar cell.

The performance values of the solar cell thus obtained when the second electrode and the counter electrode were electrically connected to each other were 0.63 V in Voc, 6.24 mA/cm$^2$ in Jsc, 0.55 in FF, and 2.16% in efficiency.

This solar cell corresponds to the cell (unit cell 2) comprised of a second electrode and a counter electrode in a cell according to the second embodiment of the present invention. Accordingly, a cell (composite cell) according to the second embodiment of the present invention can be fabricated by fabricating a porous titania layer by forming an FTO film (surface resistance: 10 Ω/sq) on a transparent conductive film in place of the PET film in the above-described solar cell, coating titania paste on the FTO film, and drying the titania paste at 450° C. for 30 minutes, and then by laminating an electrode fabricated by adsorbing the first dye to this titania layer.

Reference Example 2

Titania paste was coated on a stainless mesh substrate (25 μm in thickness) including a mesh 20 μm in diameter and dried at 450° C. for 30 minutes, thereby fabricating a porous titania layer. This coating and drying of the titania paste was repeated until the thickness of the porous titania layer reached a predetermined thickness, thereby finally fabricating a 10 μm-thick porous titania layer. A dye having the chemical structure of the dye 3 shown in FIG. 4 was adsorbed to this titania layer to fabricate a second electrode. A counter electrode was fabricated by sputtering platinum on titanium and coating titania paste (PST-400C made by Catalysts & Chemicals Industries Co., Ltd.) on the platinum, thereby forming a 10 μm-thick porous insulating film. The titania layer side of the porous titania layer fabricated as described above and insulating film side of the counter electrode were laminated so as to face each other, and a PET film (130 μm in thickness) was further laminated on a side of this porous titania layer opposite to the titania layer. In addition, an electrolytic solution was injected into the cell to fabricate a solar cell.

The performance values of the solar cell thus obtained when the second electrode and the counter electrode were electrically connected to each other were 0.63 V in Voc, 7.09 mA/cm$^2$ in Jsc, 0.64 in FF, and 2.90% in efficiency.

This solar cell corresponds to the cell (unit cell 2) comprised of a second electrode and a counter electrode in a cell according to the second embodiment of the present invention. Accordingly, a cell (composite cell) according to the second embodiment of the present invention can be fabricated by fabricating a porous titania layer by forming an FTO film (surface resistance: 10 Ω/sq) on a transparent conductive film in place of the PET film in the above-described solar cell, coating titania paste on the FTO film, and drying the titania paste at 450° C. for 30 minutes, and then by laminating an electrode fabricated by adsorbing a first dye to this titania layer.

REFERENCE SIGNS LIST

10, 10a: Dye-sensitized solar cell
12: Anode substrate
12a: Transparent substrate
12b: Conductor layer
14: First dye-carrying porous oxide semiconductor layer
16a: First electrolytic solution layer
16b: Second electrolytic solution layer
18: Porous support layer
18a: Porous conductive metal support layer
19: Iodine redox catalyst layer
20: Second dye-carrying porous oxide semiconductor layer
20a: Portion of second dye-carrying porous oxide semiconductor layer
20b: The rest of second dye-carrying porous oxide semiconductor layer
22: Cathode substrate
24: Spacer

The invention claimed is:
1. A dye-sensitized solar cell comprising:
an anode substrate;
a first dye-carrying porous oxide semiconductor layer;

a first electrolytic solution layer having an electrolytic solution;
an iodine redox catalyst layer;
a porous support layer;
a second dye-carrying porous oxide semiconductor layer;
a second electrolytic solution layer having the electrolytic solution: and
a cathode substrate,
arranged in order from an optical incidence side, wherein mobilization of the electrolytic solution between the first and second electrolytic solution layers is secured.

2. The dye-sensitized solar cell according to claim 1, wherein a conductor layer composing the anode substrate includes a porous conductive metal layer.

3. The dye-sensitized solar cell according to claim 1. wherein a dye carried by the second dye-carrying porous oxide semiconductor layer has an optical absorption wavelength longer than the optical absorption wavelength of a dye carried by the first dye-carrying porous oxide semiconductor layer.

* * * * *